United States Patent [19]

Shiozawa

[11] Patent Number: 5,491,534
[45] Date of Patent: Feb. 13, 1996

[54] EXPOSURE APPARATUS AND MICRODEVICE MANUFACTURING METHOD USING THE SAME

[75] Inventor: Takahisa Shiozawa, Utsunomiya, Japan

[73] Assignee: Canon Kabushiki Kaisha, Tokyo, Japan

[21] Appl. No.: 265,140

[22] Filed: Jun. 24, 1994

[30] Foreign Application Priority Data

Jun. 29, 1993 [JP] Japan .................................. 5-159054
Jun. 1, 1994 [JP] Japan .................................. 6-119971

[51] Int. Cl.$^6$ .............................. G01D 9/42; G03B 27/72
[52] U.S. Cl. ............................. 355/69; 355/53; 347/246
[58] Field of Search ......................... 355/53, 68, 69; 346/108

[56] References Cited

U.S. PATENT DOCUMENTS

| | | | |
|---|---|---|---|
| 4,711,568 | 12/1987 | Torigoe et al. | 355/68 |
| 4,804,978 | 2/1989 | Tracy | 346/108 |
| 4,822,975 | 4/1989 | Torigoe | 219/121.85 |
| 4,884,101 | 11/1989 | Tanimoto | 355/68 |
| 4,947,047 | 8/1990 | Muraki | 250/492.2 |
| 4,970,546 | 11/1990 | Suzuki et al. | 355/53 |
| 4,974,919 | 12/1990 | Muraki et al. | 350/6.6 |
| 5,053,614 | 10/1991 | Yui et al. | 250/205 |
| 5,107,275 | 4/1992 | Tsuruoka et al. | 346/1.1 |
| 5,119,390 | 6/1992 | Ohmori | 372/25 |
| 5,171,965 | 12/1992 | Suzuki et al. | 219/121.6 |
| 5,250,797 | 10/1993 | Sano et al. | 250/205 |

FOREIGN PATENT DOCUMENTS 61-97830   5/1986   Japan .

Primary Examiner—Michael L. Gellner
Assistant Examiner—D. P. Malley
Attorney, Agent, or Firm—Fitzpatrick, Cella, Harper & Scinto

[57] ABSTRACT

An exposure apparatus for exposing a substrate with pulses of light supplied sequentially, is disclosed. The apparatus includes a detector for detecting the light quantity of each pulse, and a controller for controlling the timing of exposure of the substrate with a pulse to be emitted, on the basis of the light quantity provided by at least one pulse preceding the pulse to be emitted.

33 Claims, 9 Drawing Sheets

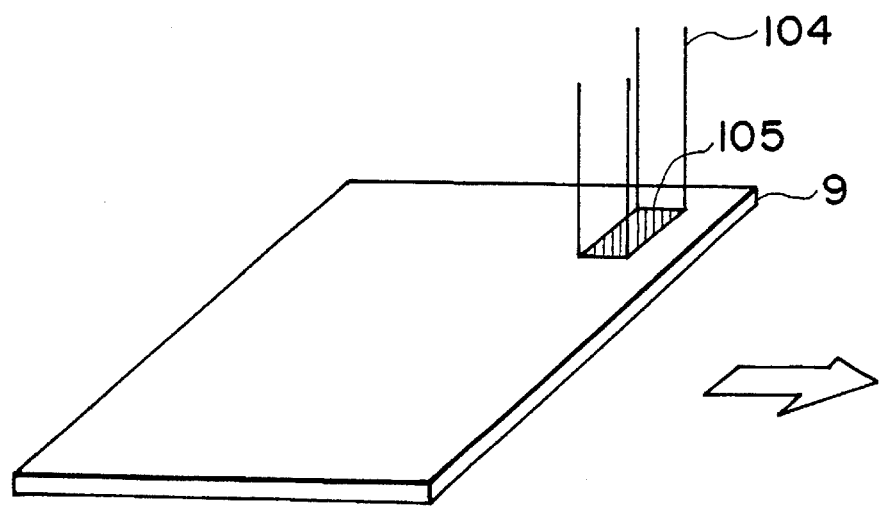
F I G. 3
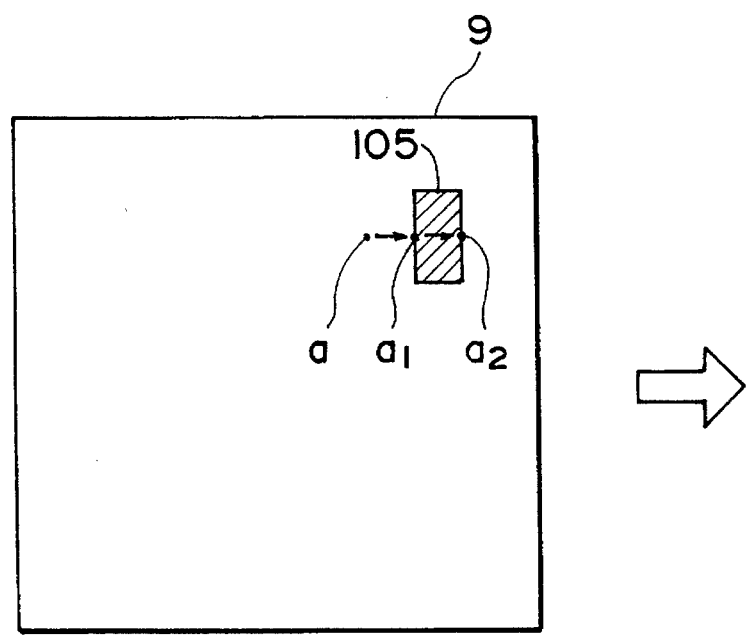
F I G. 4

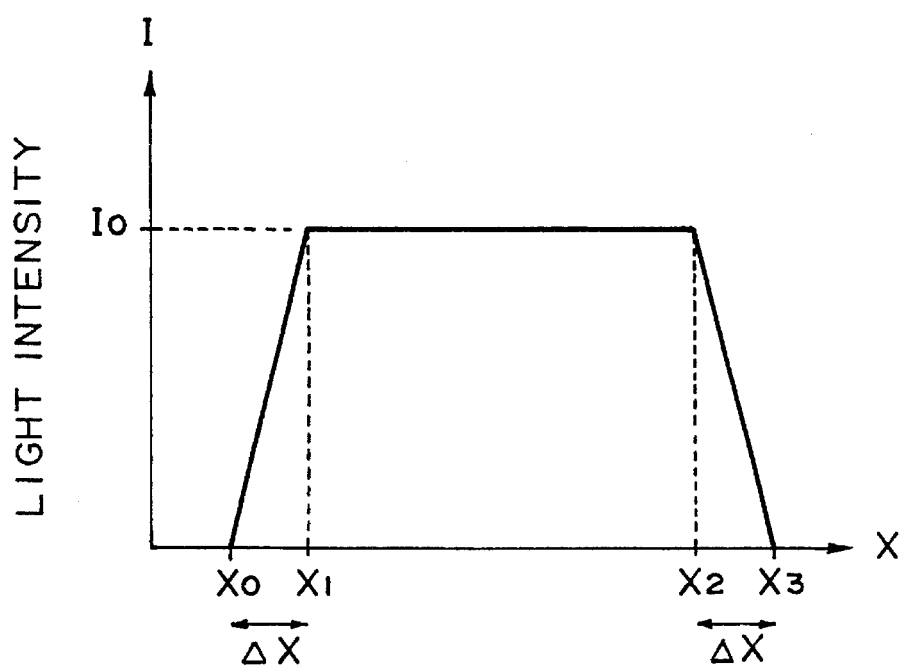
F I G. 9
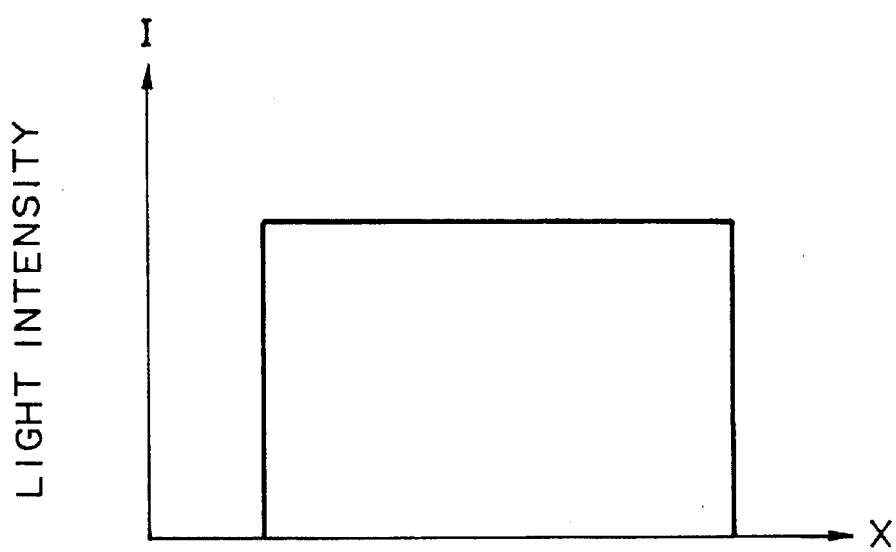
F I G. 10

EXPOSURE APPARATUS AND MICRODEVICE MANUFACTURING METHOD USING THE SAME

FIELD OF THE INVENTION AND RELATED ART

This invention relates to an exposure apparatus the and, more particularly, to an exposure apparatus for manufacture of microdevices such as semiconductor devices (e.g. ICs and LSIs), liquid crystal devices, image pickup devices (e.g. CCDs) or magnetic heads, for example, with the use of a plurality of pulses of light for exposure. In another aspect, the invention is concerned with a microdevice manufacturing method which uses an exposure apparatus such as above.

FIG. 1 is a schematic view of an example of a scanning type exposure apparatus. In FIG. 1, denoted at 201 is a light source such as a Hg lamp, for example, for providing ultraviolet light. A light emitting portion of the light source is disposed in the vicinity of the first focal point of an elliptical mirror 202, and light from this light emitting portion is collected by the elliptical mirror 202 to its second focal point 203. The light collected to the second focal point 203 is directed to and collected on the light entrance surface of an optical integrator 206 comprising a fly's eye lens, for example, through a condenser lens 204 and a mirror 205. A fly's eye lens may comprise a combination of a large number of small lenses, and a plurality of secondary light sources are defined in the vicinity of its light exit surface. Denoted at 207 is a condenser lens which serves to illuminate a masking blade means 209 (in Kohler illumination) with light from the secondary light sources. The masking blade means 209 and a reticle 212 are disposed in an optically conjugate relationship with each other with respect to an imaging lens 210 and a mirror 211. Thus, the shape and size of the illumination region upon the reticle 212 is determined by the aperture shape of the masking blade means 209. Usually, the illumination region on the reticle 212 has an oblong slit-like shape, having a shorter length in the scanning direction of the reticle 212 than that in the direction orthogonal to the scanning direction. Denoted at 213 is a projection optical system for projecting a circuit pattern of the reticle 212 onto a semiconductor substrate (wafer) 214 in a reduced scale. Denoted at 216 is a control system for moving, through driving means (not shown), the reticle 212 and the semiconductor substrate 214 at the same ratio as that of the magnification of the projection optical system 213 and at constant speeds, accurately. Denoted at 215 is a light quantity detector for monitoring a portion of light divided by a half mirror 208, to indirectly monitor the exposure amount upon the semiconductor substrate 214. Control system 218 serves to control electric power to be applied to the Hg lamp in accordance with the exposure amount calculated by a light quantity calculator 217, so as to maintain a constant exposure amount upon the semiconductor substrate 214.

By keeping constant the scanning speed of each of the reticle 212 and the semiconductor substrate 214 while maintaining the exposure amount constant, non-uniformness of exposure upon the semiconductor substrate is minimized.

SUMMARY OF THE INVENTION

If, however, a pulse emission type light source such as an excimer laser, for example, is used in this type of exposure apparatus as a light source in an attempt to enhance the throughput or improve the resolution, any fluctuation in light quantity of each pulse leads to unwanted non-uniformness of exposure amount.

It is accordingly an object of the present invention to provide an improved exposure apparatus by which non-uniformness of exposure can be reduced sufficiently.

In accordance with an aspect of the present invention, there is provided an exposure apparatus for exposing a substrate with pulses of light supplied sequentially, the apparatus comprising means for controlling the timing of exposure of the substrate with a pulse to be emitted, on the basis of a exposure amount provided by at least one pulse preceding the pulse to be emitted.

In a preferred form of the invention, the exposure amount of each pulse light may De monitored while the scan speeds of a reticle (mask) and a semiconductor substrate (wafer) may be maintained constant. When the exposure amount provided by a predetermined pulse or pulses is larger than a predetermined or desired exposure amount, the timing of emission of a subsequent pulse may De retarded. When the exposure amount provided by the predetermined pulse or pulses is not larger than the predetermined, the timing of emission of the subsequent pulse may be advanced. This enables reduction of non-uniformness of exposure amount at each point on the semiconductor substrate irrespective of a variation in light quantity of each pulse light. On an occasion when the number of pulses of light necessary for the exposure is small, in order to avoid digital error due to the number of pulses, the intensity in an end portion of distribution in the scan direction of the reticle may be changed slowly, not providing exactly uniform intensity (illuminance) distribution in the scan direction. To this end, one preferred form of the invention may preferably be provided with means for adjusting the width of the end portion of the intensity distribution, having a slow change.

Use of an exposure apparatus according to the present invention assures accurately manufacturing microdevices such as semiconductor devices (e.g. ICs or LSIs), liquid crystal devices, image pickup devices (e.g. CCDs) or magnetic heads, for example.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIG. 3 is a schematic view for explaining a reticle and an illumination region thereon.

FIG. 4 is a schematic view for explaining displacement of a point on a reticle through an illumination region.

FIG. 9 is a graph for explaining an illuminance distribution in an illumination region, in the widthwise direction of a slit.

FIG. 10 is a graph for explaining an example of a uniform illuminance distribution.

DESCRIPTION OF THE PREFERRED EMBODIMENTS

Figure 1:
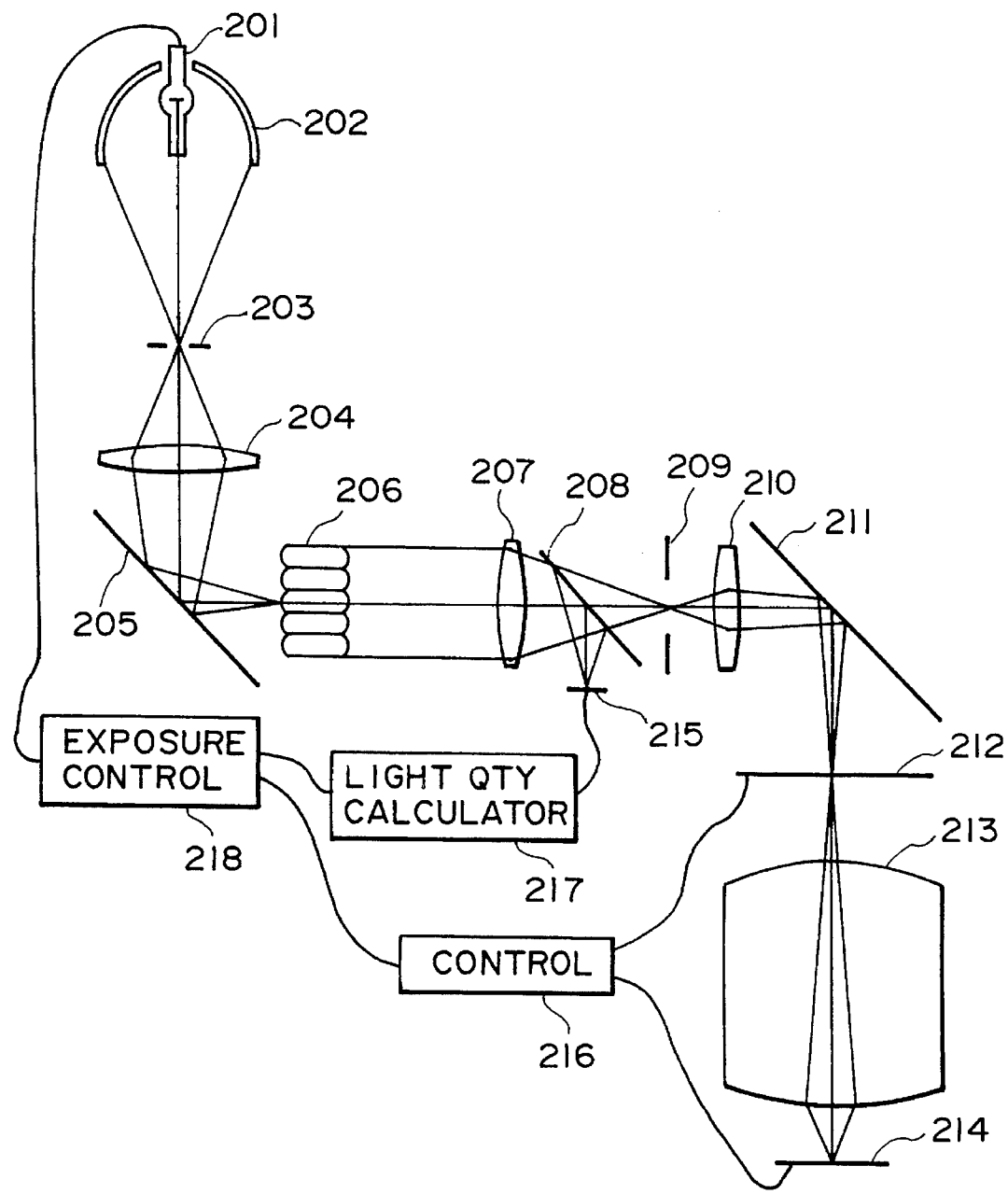
FIG. 1 is a schematic view of an example of a scanning type exposure apparatus.
Figure 2:
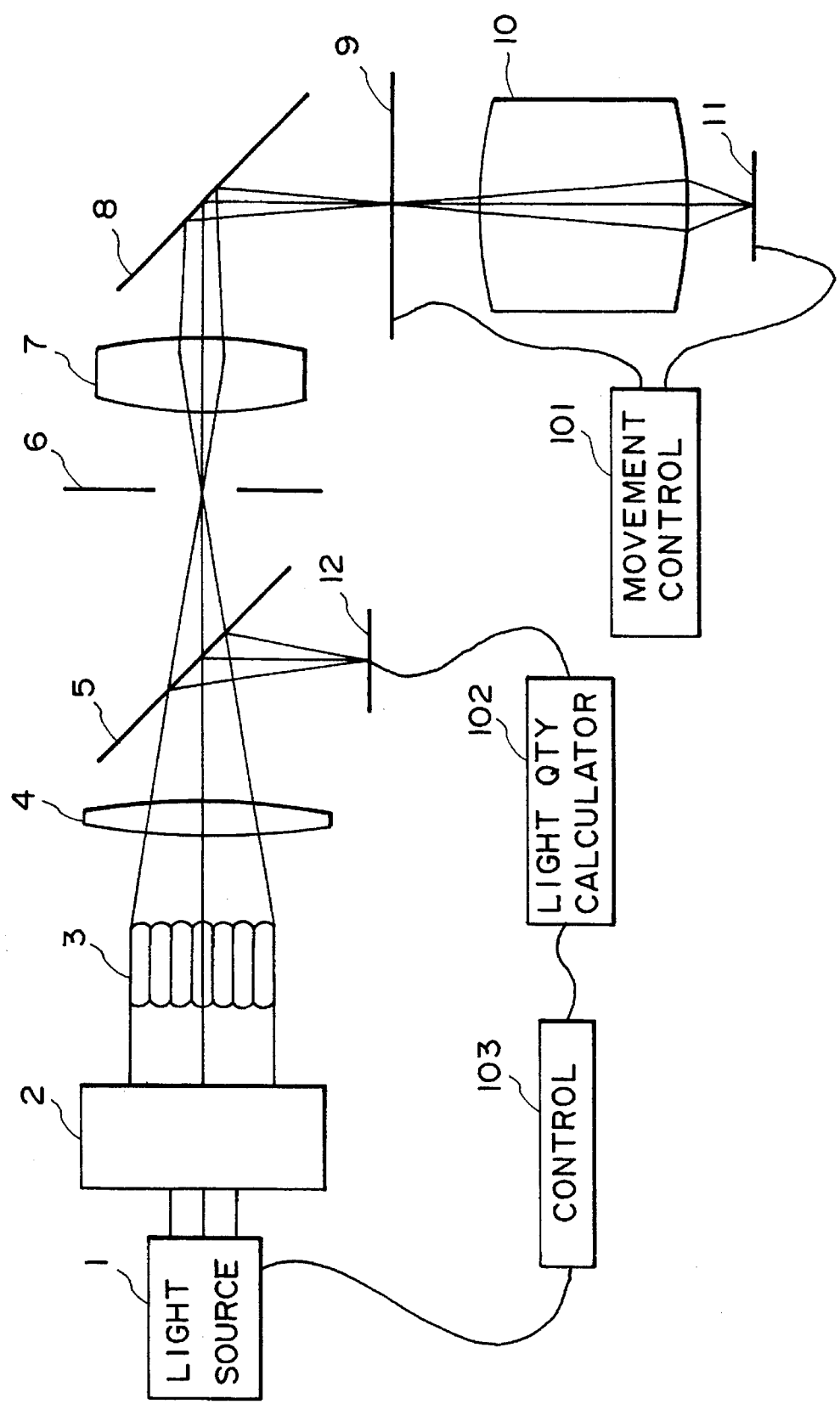
FIG. 2 is a schematic view of an exposure apparatus according to an embodiment of the present invention.

FIG. 2 is a schematic view of an embodiment the present invention, and it shows a scanning type projection exposure apparatus for the manufacture of microdevices such as semiconductor devices (e.g. ICs or LSIs), liquid crystal devices, image pickup devices (e.g. CCDs) or magnetic heads, for example.

In FIG. 2, light from a light source 1 comprising an excimer laser, for example, for emitting pulse light, is rectified into a desired shape by a beam shaping optical system 2, and it is directed to the light entrance surface of an optical integrator comprising a fly's eye lens, for example. The fly's eye lens comprises a combination of a number of small lenses, and a plurality of secondary light sources are defined in the vicinity of its light exit surface. Denoted at 4 is a condenser lens which serves to 5 illuminate a masking blade means 6 (in Kohler illumination) with light from the secondary light sources of the optical integrator. The masking blade means 6 and a reticle 9 are disposed in an optically conjugate relationship with each other with respect to an imaging lens 7 and a mirror 8. Thus, by setting the aperture shape of the masking blade means 6, the shape and size of an illumination region upon the reticle 9, to be illuminated with pulse light, is determined. Usually, the illumination region on the reticle 9 has an oblong slit-like shape, having its minor side (shorter side) disposed along the scanning direction of the reticle 9. Denoted at 10 is a projection optical system for projecting a circuit pattern formed on the reticle onto a semiconductor substrate 11 in a reduced scale. Denoted at 101 is a movement control system for moving, through unshown driving means, the reticle 9 and the semiconductor substrate 11 at the same ratio as the projection magnification of the projection optical system 10 and at constant moving speed, accurately. Denoted at 12 is a light quantity detector for monitoring a portion of pulse light divided by a half mirror 5 to thereby indirectly monitor the amount of exposure of the semiconductor substrate 11 with each pulse. Control system 103 serves to control the light emission timing of the pulse laser 1 in accordance with the exposure amount calculated by a light quantity calculator 102.

FIG. 3 illustrates the reticle 9 as moving in a direction of the arrow, perpendicular to the path of illumination light 104 during the exposure operation. As the reticle 9 moves in the direction of arrow, it is scanned and exposed with the illumination region 105 defined by the slit-like light 104. FIG. 4 is a plan view of the reticle of FIG. 3, as viewed in the direction of illumination, i.e., from the above, and it is illustrated that a point a on the reticle 9 displaces with the movement of the reticle 9, through the illumination region 105 (from position a to position $a_1$ and to position $a_2$). As the point a comes to the position $a_1$, the exposure of the point a starts and, when the point a comes to the position $a_2$, the exposure of the point a is completed.

FIGS. 5–8 are graphs for explaining an integrated exposure amount at a certain point (point a in this example) on the reticle 9, which amount increases with movement of the reticle 9. Reference character $E_0$ represents a target value of an integrated exposure amount. Reference character $T_1$ denotes the moment as the point a comes to the position $a_1$ (i.e., it just enters the illumination region: namely, the moment of a start of exposure thereof), while reference character $T_2$ denotes the moment as the point a comes to the position $a_2$ (i.e., it just goes out of the illumination region: namely, the moment of finish of exposure thereof).

Figure 5:
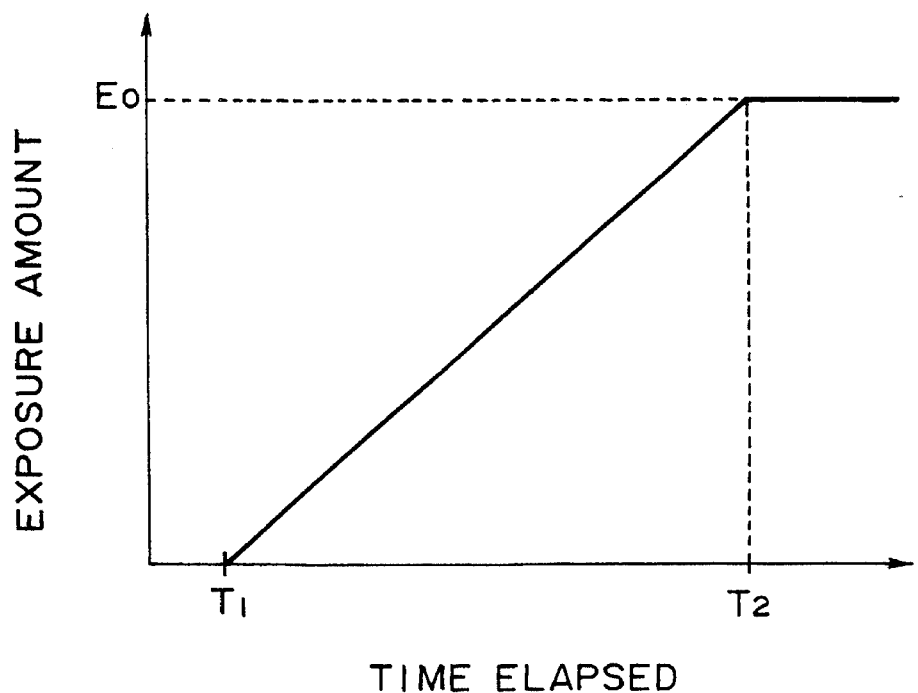
FIG. 5 is a graph for explaining integration of exposure amount in an apparatus having a continuous emission type light source such as a Hg lamp.
Figure 6:
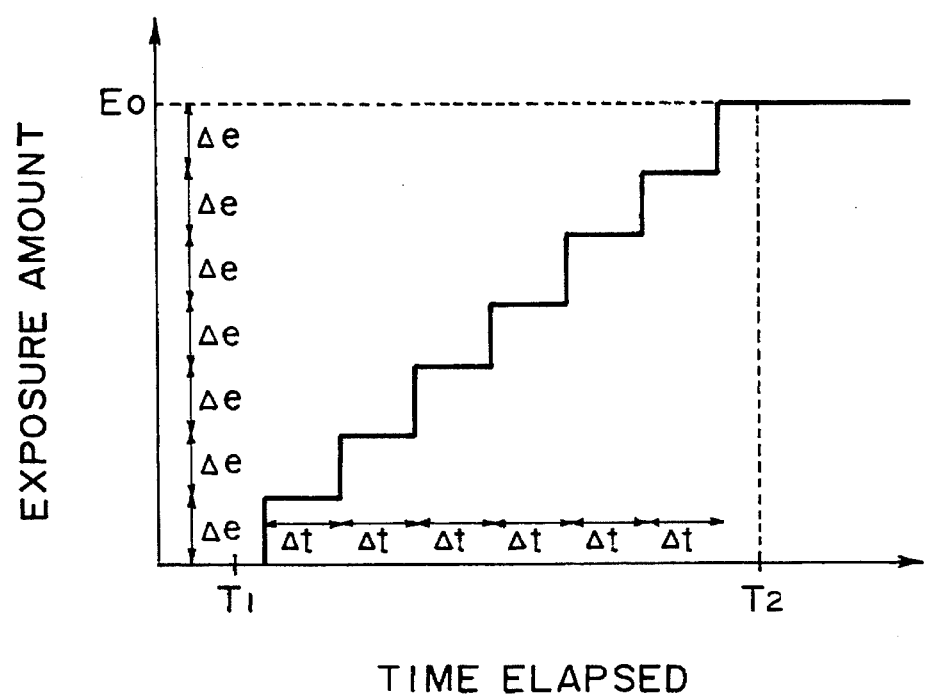
FIG. 6 is a graph for explaining integration of exposure amount provided by pulses of light of constant light quantity.

If a continuous emission type light source such as a Hg lamp is used as an exposure light source, the exposure amount increases continuously or non-intermittently from the start of exposure to the end of exposure, such as shown in FIG. 5. Thus, by setting the moving speeds of a reticle and a substrate and the quantity of energy irradiation per unit time as well as the width of irradiation slit beforehand, and by executing the exposure operation while keeping them constant, non-uniform exposure can be avoided and accurate exposure control is assured. Further, in a case where pulse light is used as exposure light as in the present invention and if the irradiated energy of each pulse is constant, then, as in the case of a continuous emission type light source, non-uniform exposure can be avoided and accurate exposure control is assured.

Figure 7:
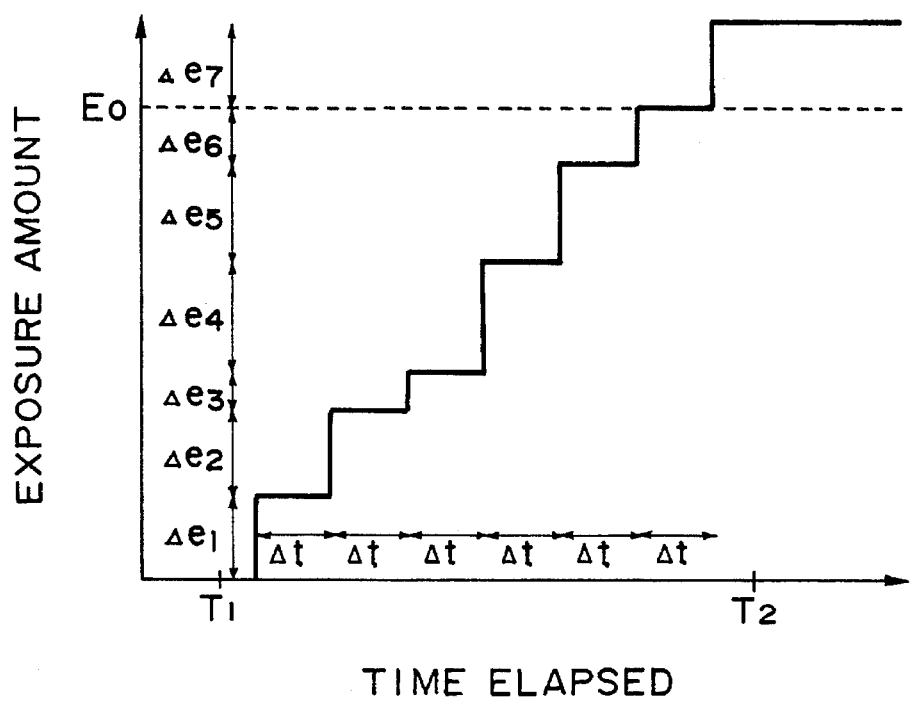
FIG. 7 is a graph for explaining integration of exposure amount provided by pulses of light of varying light quantity.

However, in a case of a pulse light source such as an excimer laser, practically it is difficult to maintain the energy of each pulse light exactly constant even though the emission frequency can be made constant. Thus, when the exposure operation is performed on the basis of conditions (e.g. set energy, set slit width, set scan speeds of a reticle and a wafer, or set emission frequency) calculated from the amount of average energy irradiation per one pulse, a possible fluctuation or variation of energy of each pulse light ends in failure of accurate exposure amount control, as illustrated in FIG. 7 (over-exposure in this example). In a scanning type exposure apparatus wherein the exposure period is substantially constant, this causes non-uniform exposure of a semiconductor substrate.

Figure 8:
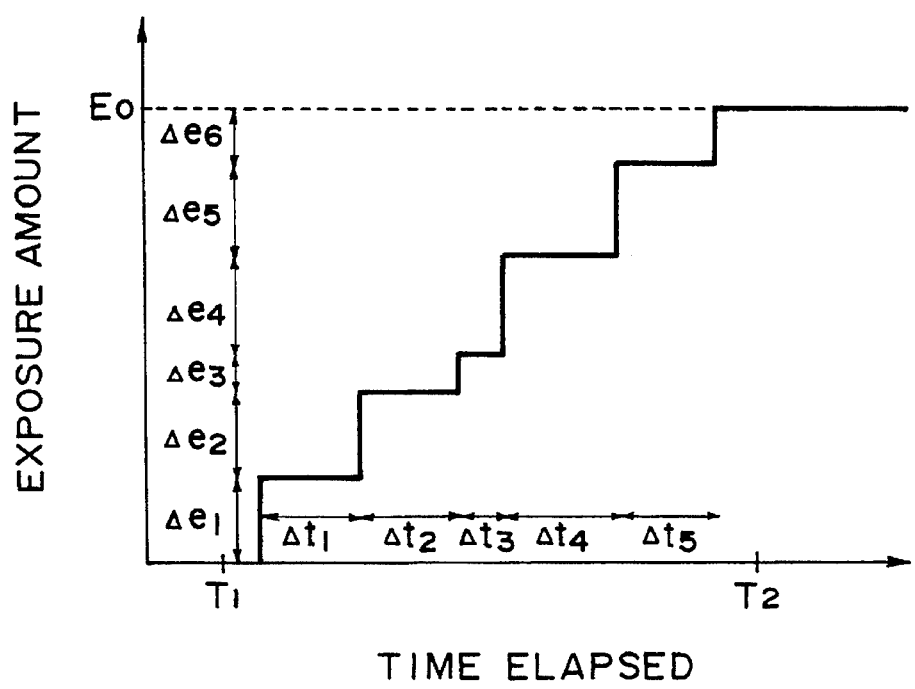
FIG. 8 is a graph for explaining integration of exposure amount in the apparatus of FIG. 2.

FIG. 8 is a graph for explaining exposure amount control in this embodiment of the present invention. Briefly, in this embodiment, during the scanning exposure during which the scanning speeds of a reticle and a semiconductor substrate are maintained constant, the exposure amount provided by each pulse applied sequentially is monitored: if the exposure amount provided by a light pulse or pulses is greater than a predetermined or desired level, the timing of emission of the succeeding light pulse is retarded, if on the other hand the exposure amount provided by a light pulse or pulses is less than a predetermined or desired level, the timing of emission of the succeeding pulse is advanced. This enables minimizing non-uniformness of exposure amount at each point on the semiconductor substrate regardless of variation in light quantity of a each pulse.

Figure 13:
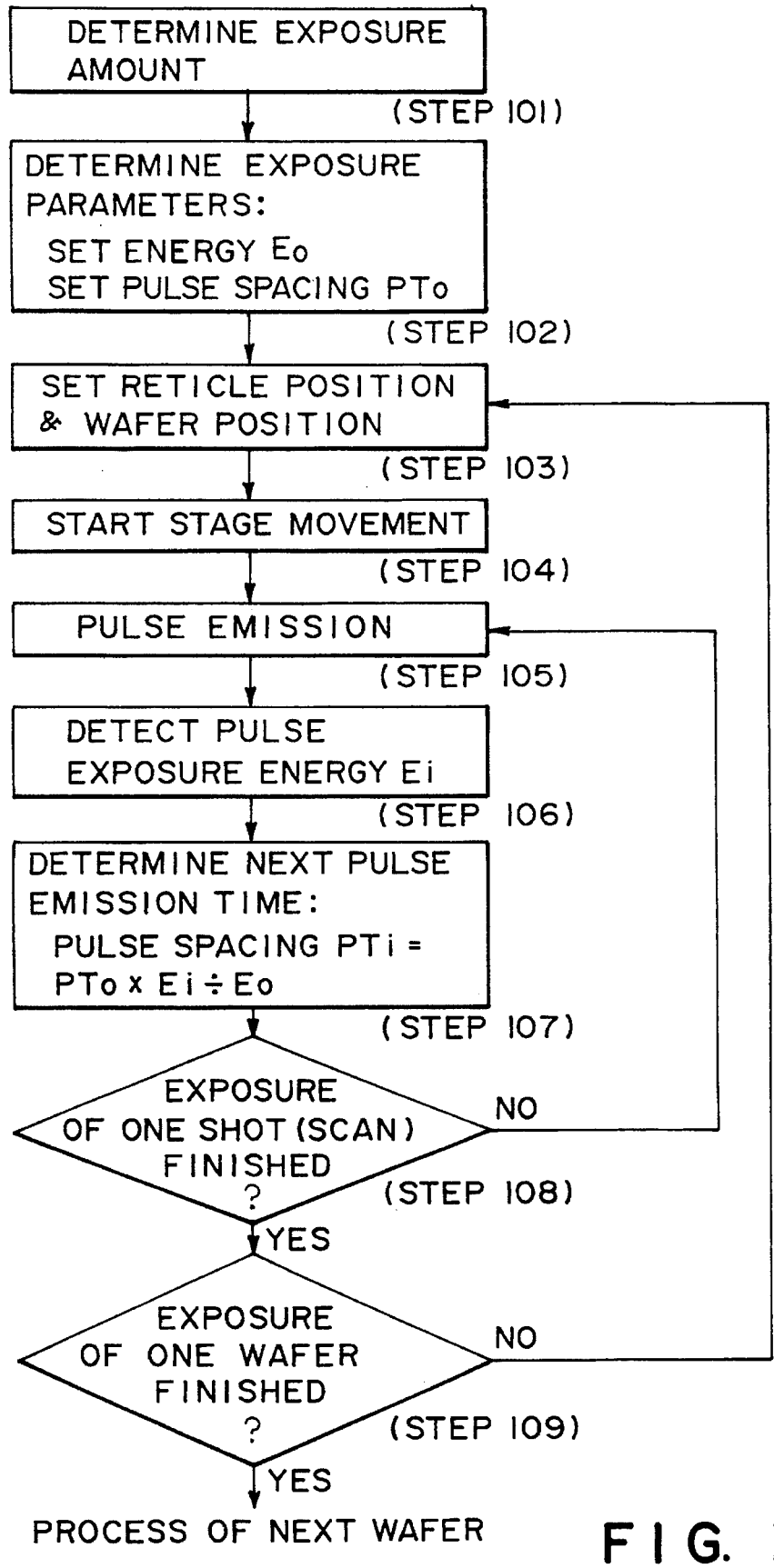
FIG. 13 is a flow chart of exposure amount control in the apparatus of FIG. 2 embodiment.

FIG. 13 is a flow chart of the exposure control sequence. At step 101, the exposure amount necessary for exposure of a resist of a substrate is determined, this being done by using a test wafer, for example. At step 102, on the basis of the necessary exposure amount determined at step 101, set energy of excimer laser 1, laser emission frequency and width of the slit of blade 6 as well as the moving speeds of a reticle stage and a wafer stage, are determined. These parameters are determined while taking into account that the stage moving speed, the emission frequency or the minimum number of exposure pulses all can be changed to reduce non-uniformness of exposure amount, and also they are determined so as to increase the throughput as much as possible. If necessary, an ND (neutral density) filter may be used to adjust the light quantity. At step 103, a wafer and a reticle are set at their predetermined positions, for preparation of a start of an exposure operation, and the relative position of the wafer and the reticle is adjusted. After the relative alignment of them is accomplished, movement of the reticle stage and the wafer stage as well as emission of laser 1 start (steps 104 and 105). In a case where the emission of laser 1 starts before the region of the reticle 9 to be exposed enters the area to be irradiated with the illumination light, a light blocking region may preferably be provided on the reticle 9 or a shutter of the laser may preferably be kept closed, so as to prevent the exposure light from impinging on the wafer. At step 106, the energy $E_i$ of the pulse light used to perform the exposure is detected. Here, on the basis of the set pulse exposure energy $E_0$ and the actually detected pulse exposure energy $E_i$, the moment of emission of the succeeding pulse light is determined (step 107). Then, if the exposure of one shot (one scan) is not completed, the succeeding pulse light is emitted at the moment calculated.

Preferably the set energy of laser 1 may be calibrated with respect to the exposure amount detecting system of the exposure apparatus, and an average exposure amount corresponding to the set energy of laser 1 may be preferably measured beforehand.

In the embodiment described, exposures are executed sequentially with pulse lights $p_1, p_2, p_3, p_4, \ldots$ and the timing of emission of pulse light $p_i$ is controlled on the basis of the exposure amount provided by the preceding pulse light $p_{i-1}$. However, the emission timing may be controlled on the basis of the exposure amount provided by pulse light $p_{i-2}$ or pulse light $p_{i-3}$, for example, not just preceding to the pulse light $p_i$. It may however be desirable to control the emission on the basis of a pulse close to the pulse to be emitted. Further, the moment of emission of pulse $p_i$ may be controlled on the basis of the exposure amount provided by plural pulses close to the pulse $p_i$ (e.g., on the basis of a total exposure amount provided by pulses $p_{i-1}$ and $p_{i-2}$).

In the embodiment described, in relation to the detected exposure amount provided by the or a preceding pulse light, the time interval to the emission of the pulse to be emitted subsequently is calculated to control the moment of emission of the pulse to be emitted subsequently. However, as an alternative, in relation to the detected exposure amount the position of the reticle or the wafer to be exposed with the subsequent pulse may be calculated, and the timing of emission of the subsequent pulse may be controlled so that, at the moment that the reticle or wafer comes to that position, the pulse may be emitted. This may be particularly effective in a case where the moving speed of the reticle or wafer has a small fluctuation. On that occasion, the positional information related to the reticle or wafer may preferably be monitored and detected continuously by using a high-precision laser interferometer, for example.

If a large number of pulses of light (e.g., a few hundred pulses) are to be used for the exposure process, particular attention may not be paid to the illuminance distribution on the reticle 9 in the scanning direction of the same, and an exactly uniform distribution such as shown in FIG. 10 may be provided. However, if the number of light pulses to be used for the exposure process is not large, in order to avoid digital error due to the pulse number, the illumination may be done with the distribution in the marginal region being changed gently such as shown in FIG. 9. This enables a more accurate control of exposure amount.

More specifically, the marginal regions ($\Delta X$ in FIG. 9) of the illuminance distribution (intensity distribution in section) in the scan direction of the reticle 9 preferably satisfy a relation $\Delta X = M \times$ (average reticle movement distance per one pulse), where M is a natural number, and also preferably these marginal regions are symmetric as illustrated in FIG. 9 (a shape near the illustrated may be satisfactory). As an example, after a uniform illuminance distribution is formed, at least one blade of the masking blade means 6 of FIG. 2 may be moved in the direction of the optical axis, to cause a small defocus of the image thereof upon the reticle 9 to thereby blur the illumination region on the reticle 9.

In the present embodiment, the masking blade means comprises two orthogonal variable slits and, of these variable slits, the image of the one slit which determines the width of the illumination region in the scan direction can be defocused to adjust the magnitude of $\Delta X$ as desired.

In the present embodiment, the image of the aperture of the masking blade means 6 is projected onto the pattern surface of the reticle 9 through the imaging lens 7. However, use of the imaging lens 7 is not always necessary. For example, the masking blade means may be disposed just before the reticle 9.

In the initial setting of emission frequency, to the maximum frequency of a pulse light source used, the emission frequency may desirably be set to a level taking into account the energy variation of each pulse. For example, on an occasion when a laser having a pulse energy fluctuation of ±5% and having a maximum emission frequency of 500 Hz is used and where the emission timing is controlled on the basis of just the preceding one pulse, since the emission frequency is expected to have a variation of 5%, the frequency should desirably be set in the initial setting to 475 Hz or lower.

Next, an embodiment of a semiconductor device manufacturing method using the projection exposure apparatus of the FIG. 2 embodiment, will be explained.

Figure 11:
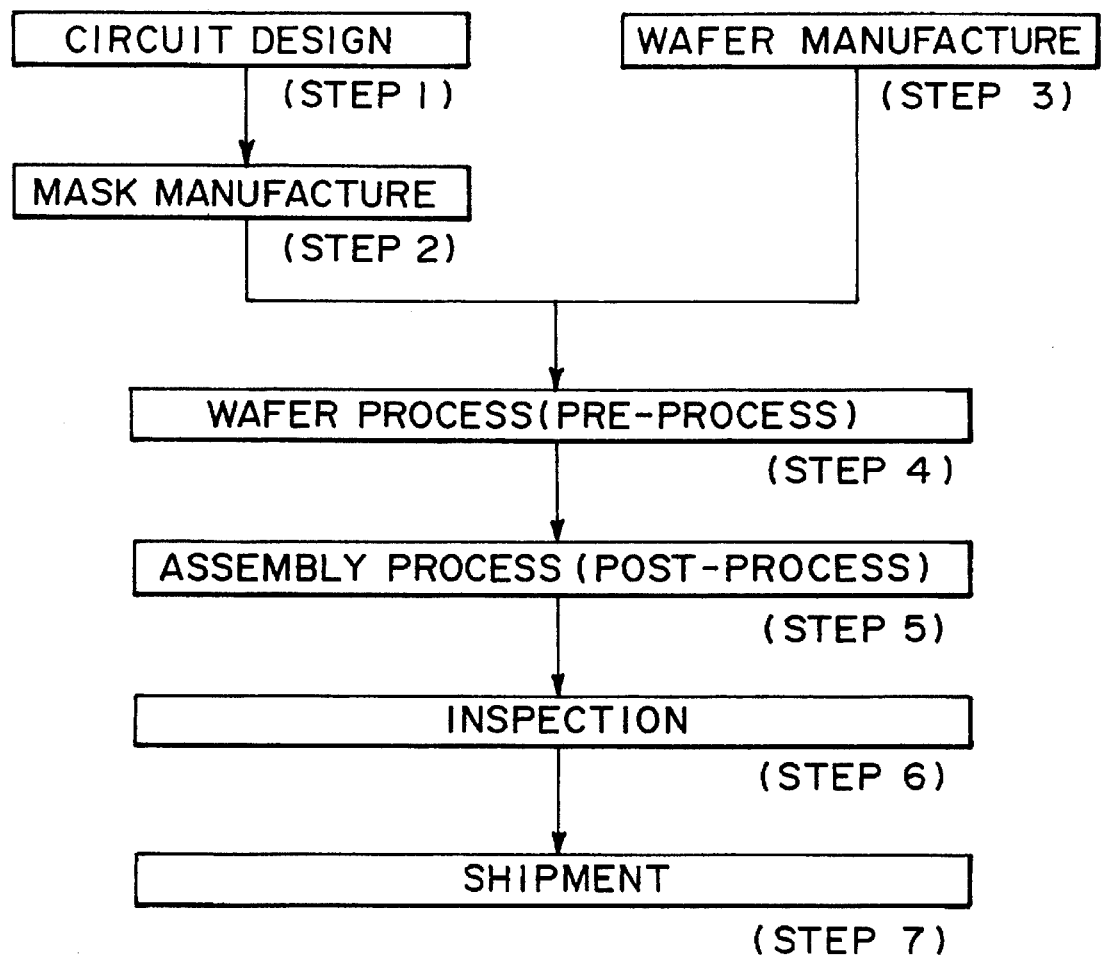
FIG. 11 is a flow chart of semiconductor device manufacturing processes.

FIG. 11 is a flow chart of the sequence of manufacturing a semiconductor device such as a semiconductor chip (e.g. IC or LSI), a liquid crystal panel or a CCD, for example. Step 1 is a design process for designing the circuit of a semiconductor device. Step 2 is a process for manufacturing a mask on the basis of the circuit pattern design. Step 3 is a process for manufacturing a wafer by using a material such as silicon.

Step 4 is a wafer process which is called a pre-process wherein, by using the so prepared mask and wafer, circuits are practically formed on the wafer through lithography. Step 5 subsequent to this is an assembling step which is called a post-process wherein the wafer processed by step 4 is formed into semiconductor chips. This step includes assembling (dicing and bonding) and packaging (chip sealing). step 6 is an inspection step wherein operability check, durability check and so on of the semiconductor devices produced by step 5 are carried out. With these processes, semiconductor devices are finished and they are shipped (step 7).

Figure 12:
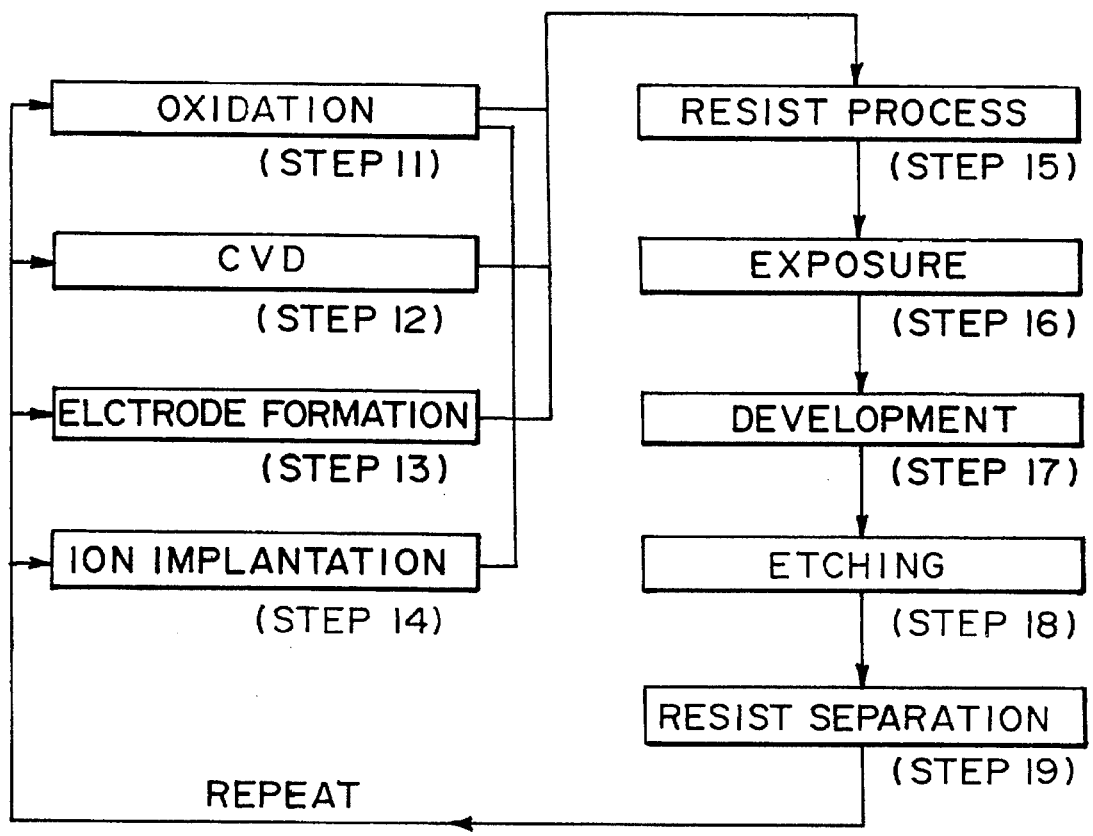
FIG. 12 is a flow chart of a wafer process.

FIG. 12 is a flow chart showing details of the wafer process. Step 11 is an oxidation process for oxidizing the surface of a wafer. Step 12 is a CVD process for forming an insulating film on the wafer surface. Step 13 is an electrode forming process for forming electrodes on the wafer by vapor deposition. Step 14 is an ion implanting process for implanting ions to the wafer. Step 15 is a resist process for applying a resist (photosensitive material) to the wafer. Step 16 is an exposure process for printing, by exposure, the circuit pattern of the mask on the wafer through the exposure apparatus described above. Step 17 is a developing process for developing the exposed wafer. Step 18 is an etching process for removing portions other than the developed resist image. Step 19 is a resist separation process for separating the resist material remaining on the wafer after being subjected to the etching process. By repeating these processes, circuit patterns are superposedly formed on the wafer.

While the invention has been described with reference to the structures disclosed herein, it is riot confined to the details set forth and this application is intended to cover such modifications or changes as may come within the purposes of the improvements or the scope of the following claims.

What is claimed is:

1. An exposure apparatus for exposing a substrate with pulses of light supplied sequentially, said apparatus comprising:
   means for detecting the light quantity of a pulse; and
   means for controlling the timing of emission of a pulse to be emitted, on the basis of the light quantity provided by at least one pulse preceding the pulse to be emitted.

2. An apparatus according to claim 1, wherein said controlling means controls the timing of emission on the basis of information related to the light quantity provided by the preceding pulse, just preceding the pulse to be emitted.

3. An apparatus according to claim 1, wherein said controlling means controls the timing of emission on the basis of the light quantity provided by a plurality of pulses preceding the pulse to be emitted.

4. An apparatus according to claim 1, wherein said controlling means retards the timing of emission when the light quantity of a pulse preceding the pulse to be emitted is larger than a predetermined light quantity, and advances the timing of emission when the light quantity of a pulse preceding the pulse to be emitted is not larger than the predetermined light quantity.

5. An apparatus according to claim 1, further comprising an excimer laser for supplying the light pulses.

6. An apparatus according to claim 1, further comprising scanning means for scanning a mask and the substrate with pulses of light.

7. An apparatus according to claim 6, wherein said controlling means retards the timing of emission when the light quantity of a pulse preceding the pulse to be emitted is larger than a predetermined light quantity, and advances the timing of emission when the light quantity of a pulse preceding the pulse to be emitted is not larger than the predetermined light quantity.

8. An apparatus according to claim 7, wherein said controlling means controls the timing of emission on the basis of information related to the light quantity provided by the preceding pulse, just preceding the pulse to be emitted.

9. An apparatus according to claim 7, wherein said controlling means controls the the timing of emission on the basis of the light quantity provided by a plurality of pulses preceding the pulse to be emitted.

10. An apparatus according to claim 7, further comprising an excimer laser for supplying the pulses of light.

11. An apparatus according to claim 7, wherein each pulse has a sectional intensity distribution in a scanning direction, and wherein the intensity changes slowly in a marginal portion of the intensity distribution.

12. An apparatus according to claim 11, further comprising light blocking means, including a plurality of light blocking plates, for restricting an illumination region to be irradiated with a pulse, and wherein at least one of said light blocking plates is movable in the direction of an optical axis of a pulse.

13. An apparatus according to claim 11, wherein the sectional intensity distribution has an approximately trapezoidal shape, and wherein the length in the scanning direction of a region, corresponding to the bottom of the trapezoidal shape, is substantially equal to the product of multiplying a movement distance of the substrate per one pulse by a natural number.

14. A device manufacturing method in which a workpiece is exposed with pulses of light supplied sequentially, said method comprising the steps of:
   detecting the light quantity of at least one pulse emitted; and
   controlling the timing of emission of a pulse to be emitted, on the basis of the detected light quantity.

15. A method according to claim 14, wherein, in said controlling step, the timing of emission is retarded when the detected light quantity of the at least one pulse is larger than a predetermined light quantity, and wherein the timing of emission is advanced when the detected light quantity of the at least one pulse is not larger than the predetermined light quantity.

16. A method according to claim 15, wherein, in said controlling step, the timing of emission of a pulse to be emitted is controlled on the basis of the light quantity of the preceding pulse.

17. A method according to claim 15, wherein, in said controlling step, the timing of emission of a pulse to be emitted is controlled on the basis of the light quantity of plural pulses preceding the pulse to be emitted.

18. A method according to claim 14, further comprising scanning the workpiece and a mask with pulses of light to expose the workpiece to the mask.

19. A method according to claim 18, wherein, in said controlling step, the timing of emission is retarded when the detected light quantity of the at least one pulse is larger than a predetermined light quantity, and the timing of emission is advanced when the detected light quantity of the at least one pulse is not larger than the predetermined light quantity.

20. A method according to claim 19, wherein, in said controlling step, the timing of emission of a pulse to be emitted is controlled on the basis of the light quantity of the preceding pulse.

21. A method according to claim 19, wherein, in said controlling step, the timing of emission of a pulse to be emitted is controlled on the basis of the light quantity of plural pulses preceding the pulse to be emitted.

22. A method according to claim 18, wherein each pulse has a sectional intensity distribution in a scanning direction, and wherein the intensity changes slowly in a marginal portion of the intensity distribution.

23. A method according to claim 22, wherein the sectional intensity distribution has an approximately trapezoidal shape, and wherein the length in the scanning direction of a region, corresponding to the bottom of the trapezoidal shape, is substantially equal to the product of multiplying a movement distance of the substrate per one pulse by a natural number.

24. A scanning exposure apparatus for exposing a substrate with light pulses emitted sequentially, said apparatus comprising:
   scanning means for scanningly moving the substrate relative to light pulses;
   detecting means for detecting the light quantity of light pulses; and control means, operable on the basis of (i) the light quantity of at least one emitted light pulse, being emitted before emission of a subsequent light pulse, (ii) a reference light quantity preset for each light pulse and (iii) a reference period preset for each light pulse, for determining the period for the subsequent light pulse, and for controlling the timing of emission of the subsequent pulse light in accordance with the determination.

25. An apparatus according to claim 24, further comprising an excimer laser for providing the light pulses.

26. An apparatus according to claim 24, wherein said control means retards the timing of emission of the subsequent light pulse when the light quantity of the at least one light pulse is larger than a preset light quantity, and advances the timing of emission of the subsequent light pulse when the light quantity of the at least one light pulse is not larger than the preset light quantity.

27. An apparatus according to claim 24, wherein each light pulse has a sectional intensity distribution of approximately trapezoidal shape, and wherein the length in a scanning direction of a region, corresponding to the bottom of the trapezoidal shape, is substantially equal to the product of multiplying a movement distance of the substrate per one light pulse by a natural number.

28. A scanning exposure apparatus for exposing a substrate with light pulses emitted sequentially, said apparatus comprising:

scanning means for scanningly moving the substrate relative to light pulses;

detecting means for detecting the light quantity of light pulses; and control means, operable on the basis of (i) the light quantity of at least one emitted light pulse, being emitted before emission of a subsequent light pulse, (ii) a reference light quantity being preset for each light pulse and (iii) a reference position of the substrate being preset in relation to each pulse to be emitted, for determining the position of the substrate to be taken in relation to the subsequent light pulse, and for controlling the timing of emission of the subsequent pulse light in accordance with the determination.

29. An apparatus according to claim 28, further comprising an excimer laser for providing the light pulses.

30. An apparatus according to claim 28, wherein said control means retards the timing of emission of the subsequent light pulse when the light quantity of the at least one light pulse is larger than a preset light quantity, and advances the timing of emission of the subsequent light pulse when the light quantity of the at least one light pulse is not larger than the preset light quantity.

31. An apparatus according to claim 28, wherein each light pulse has a sectional intensity distribution of approximately trapezoidal shape, and wherein the length in a scanning direction of a region, corresponding to the bottom of the trapezoidal shape, is substantially equal to the product of multiplying a movement distance of the substrate per one light pulse by a natural number.

32. A scanning exposure apparatus for exposing a substrate with light pulses emitted sequentially, said apparatus comprising:

scanning means for scanningly moving the substrate relative to light pulses; and light pulse supplying means for supplying light pulses each having a sectional intensity distribution, in a scanning direction, of approximately trapezoidal shape, and wherein the length in the scanning direction of a region, corresponding to the bottom of the trapezoidal shape, is substantially equal to the product of multiplying a movement distance of the substrate per one light pulse by a natural number.

33. An apparatus according to claim 32, wherein said light pulse supplying means comprises an excimer laser for providing light pulses.

* * * * *

UNITED STATES PATENT AND TRADEMARK OFFICE
CERTIFICATE OF CORRECTION

PATENT NO. : 5,491,534  Page 1 of 2
DATED : February 13, 1996
INVENTOR(S) : Takahisa SHIOZAWA It is certified that error appears in the above-indentified patent and that said Letters Patent is hereby corrected as shown below:

ON THE COVER PAGE,

Under "U.S. PATENT DOCUMENTS", item [56]:

The following should be inserted:

--4,519,692  5/1985  Michalik
  5,191,374  3/1993  Hazama, et al.
  3,823,318  7/1974  Krause--

COLUMN 1:

Line 8, "the" should be deleted; and
Line 9, "for" should read --for the--.

COLUMN 2:

Line 11, "a" should read --an--;
Line 14, "De" should read --be--; and
Line 19, "De" should read --be--.

UNITED STATES PATENT AND TRADEMARK OFFICE
CERTIFICATE OF CORRECTION

PATENT NO. : 5,491,534
DATED : February 13, 1996
INVENTOR(S) : Takahisa SHIOZAWA It is certified that error appears in the above-indentified patent and that said Letters Patent is hereby corrected as shown below:

COLUMN 3:

Line 30, "5" should be deleted; and
Line 63, "the" (second occurrence) should be deleted.

COLUMN 4:

Line 52, "retarded," should read --retarded;--;
Line 57, "of" should read --of a--; and
Line 58, "a" should be deleted.

COLUMN 7:

Line 57, "the" (second occurrence) should be deleted.

Signed and Sealed this

Twenty-second Day of October, 1996

Attest:

BRUCE LEHMAN

*Attesting Officer*     *Commissioner of Patents and Trademarks*